(12) United States Patent
Zhang et al.

(10) Patent No.: US 10,943,898 B2
(45) Date of Patent: Mar. 9, 2021

(54) HIGH SWITCHING FREQUENCY, LOW LOSS AND SMALL FORM FACTOR FULLY INTEGRATED POWER STAGE

(71) Applicant: INTERNATIONAL BUSINESS MACHINES CORPORATION, Armonk, NY (US)

(72) Inventors: Xin Zhang, Yorktown Heights, NY (US); Ko-Tao Lee, Yorktown Heights, NY (US); Todd E. Takken, Brewster, NY (US); Paul W. Coteus, Yorktown Heights, NY (US); Andrew Ferencz, Southborough, MA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/663,779

(22) Filed: Oct. 25, 2019

(65) Prior Publication Data
US 2020/0058639 A1    Feb. 20, 2020

Related U.S. Application Data

(62) Division of application No. 15/887,589, filed on Feb. 2, 2018, now Pat. No. 10,535,650.

(51) Int. Cl.
| | | |
|---|---|---|
| *H01L 27/06* | (2006.01) | |
| *H01L 29/20* | (2006.01) | |
| *H01L 29/66* | (2006.01) | |
| *H01L 21/768* | (2006.01) | |
| *H01L 21/8258* | (2006.01) | |

(Continued)

(52) U.S. Cl.
CPC ...... *H01L 27/0605* (2013.01); *H01L 21/0254* (2013.01); *H01L 21/02381* (2013.01); *H01L 21/76895* (2013.01); *H01L 21/8258* (2013.01); *H01L 21/84* (2013.01); *H01L 23/528* (2013.01); *H01L 27/085* (2013.01);
(Continued)

(58) Field of Classification Search
CPC ......... H01L 29/66431; H01L 29/66462; H01L 29/778–7789; H01L 2924/13064; H01L 29/122–127; H01L 29/15–158
See application file for complete search history.

(56) References Cited

U.S. PATENT DOCUMENTS

| | | |
|---|---|---|
| 4,796,145 A | 1/1989 | Oshikiri |
| 10,269,950 B2 | 4/2019 | Yamada |

(Continued)

OTHER PUBLICATIONS

List of IBM Patents or Patent Applications Treated as Related dated Oct. 25, 2019, 2 pages.

*Primary Examiner* — Selim U Ahmed
*Assistant Examiner* — Evan G Clinton
(74) *Attorney, Agent, or Firm* — Tutunjian & Bitetto, P.C.; Erik Johnson

(57) ABSTRACT

A method for fabricating a semiconductor device includes, for a substrate having a first region protected by a cap layer, forming a first device on a second region of the substrate. The substrate includes an insulator layer disposed between a first semiconductor layer and a second semiconductor layer each including a first semiconductor material. The method further includes forming a second device on the first region, including forming one or more transistors each having a channel formed from a second semiconductor material different from the first semiconductor material.

20 Claims, 16 Drawing Sheets

(51) Int. Cl.
*H01L 21/84* (2006.01)
*H01L 27/12* (2006.01)
*H01L 21/02* (2006.01)
*H01L 23/528* (2006.01)
*H01L 27/085* (2006.01)
*H03K 17/687* (2006.01)
*H01L 21/311* (2006.01)
*H01L 29/417* (2006.01)
*H01L 29/778* (2006.01)

(52) U.S. Cl.
CPC ...... H01L 27/1203 (2013.01); H01L 29/2003 (2013.01); H01L 29/6656 (2013.01); H01L 29/66446 (2013.01); *H01L 21/0217* (2013.01); *H01L 21/02458* (2013.01); *H01L 21/31116* (2013.01); *H01L 29/41766* (2013.01); *H01L 29/778* (2013.01); *H03K 17/6871* (2013.01)

(56) References Cited

U.S. PATENT DOCUMENTS

| | | |
|---|---|---|
| 2005/0282372 A1 | 12/2005 | Rossi et al. |
| 2007/0046105 A1* | 3/2007 | Johnson ............ H02M 3/33561 307/29 |
| 2010/0033237 A1 | 2/2010 | Liang et al. |
| 2011/0180806 A1* | 7/2011 | Hebert .............. H01L 21/76281 257/76 |
| 2013/0168686 A1* | 7/2013 | Hsu ...................... H01L 29/267 257/76 |
| 2015/0349107 A1 | 12/2015 | Liao |
| 2016/0163543 A1* | 6/2016 | Kim .................... H01L 45/1233 438/492 |
| 2016/0225887 A1 | 8/2016 | Gallagher et al. |
| 2016/0336314 A1* | 11/2016 | Chou .................. H01L 21/8252 |
| 2018/0331682 A1* | 11/2018 | Duduman ............ H03K 17/063 |

* cited by examiner

HIGH SWITCHING FREQUENCY, LOW LOSS AND SMALL FORM FACTOR FULLY INTEGRATED POWER STAGE

BACKGROUND

The present invention generally relates to semiconductor devices, and more particularly to fully integrated power stage devices.

Power stages are key components for power conversion circuits, including but not limited to buck converters and forward converters.

SUMMARY

In accordance with an embodiment of the present invention, a semiconductor device is provided. The device includes a first circuit formed on a substrate in a first region. The substrate includes a first semiconductor material. The device further includes a second circuit formed on the substrate in a second region. The second circuit includes one or more transistors having channels formed from a second semiconductor material different from the first semiconductor material. The device further includes connections between the first circuit and respective gates of the transistors of the second circuit.

In accordance with another embodiment of the present invention a semiconductor device is provided. The device includes a first circuit including a gate driver circuit of a power stage formed on a substrate in a first region. The substrate includes a first semiconductor material. The device further includes a second circuit formed on the substrate in a second region. The second circuit includes one or more transistors having channels formed from a second semiconductor material different from the first semiconductor material and serving as power transistors of the power stage. The device further includes connections between the first circuit and respective gates of the transistors of the second circuit.

In accordance with yet another embodiment of the present invention, a method for fabricating a semiconductor device is provided. The method includes forming a dielectric layer on a substrate including a first semiconductor material, forming a trench region within a first region of the substrate by removing a portion of the substrate and the dielectric layer, conformally depositing a spacer layer along the substrate and the dielectric layer, forming sidewalls within the trench by removing portions of the spacer layer, epitaxially growing a second semiconductor material within the trench region. The second semiconductor material is different from the first semiconductor material. The method further includes planarizing down to the substrate after epitaxially growing the second semiconductor material, forming a cap layer on the first region, forming first devices on a substrate in a second region while the first region is capped by the cap layer, and forming a second device on the substrate in the first region. The second device includes one or more transistors having channels including the second semiconductor material.

In accordance with yet another embodiment of the present invention, a method for fabricating a semiconductor device is provided. The method includes, for a substrate having a first region protected by a cap layer, forming a first device on a second region of the substrate. The substrate include an insulator layer disposed between a first semiconductor layer and a second semiconductor layer each including a first semiconductor material. The method further includes forming a second device on the first region, including forming one or more transistors each having a channel formed from a second semiconductor material different from the first semiconductor material.

In accordance with yet another embodiment of the present invention, a method for fabricating a semiconductor device is provided. The method includes, for a substrate including an insulator layer disposed between a first semiconductor layer and a second semiconductor layer each including a first semiconductor material, forming a drench within a first region of the substrate to the first semiconductor layer. The method further includes forming a second semiconductor material different from the first semiconductor material within the trench, forming a cap layer on the first region of the substrate, and forming a first device on a second region of the substrate. The cap layer protects the first region during the formation of the first device. The method further includes forming a second device on the first region, including forming one or more transistors each having a channel formed from the second semiconductor material.

In accordance with yet another embodiment of the present invention, a method for fabricating a semiconductor device is provided. The method includes forming a dielectric layer on a substrate including an insulator layer disposed between a first semiconductor layer and a second semiconductor layer each including a first semiconductor material, forming a trench region within a first region of the substrate to the first semiconductor layer by removing a portion of the substrate and the dielectric layer, conformally depositing a spacer layer along the substrate and the dielectric layer, forming sidewalls within the trench by removing portions of the spacer layer, epitaxially growing a second semiconductor material within the trench region, the second semiconductor material being different from the first semiconductor material, planarizing down to the substrate after epitaxially growing the second semiconductor material, forming a cap layer on the first region, and forming a first device including a gate driver circuit of a power stage on a substrate in a second region. The cap layer protects the first region during the formation of the first device. The method further includes forming a second device on the substrate in the first region, including forming one or more power transistors of the power stage having channels including the second semiconductor material, and connecting the first device with respective gates of the one or more transistors of the second device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
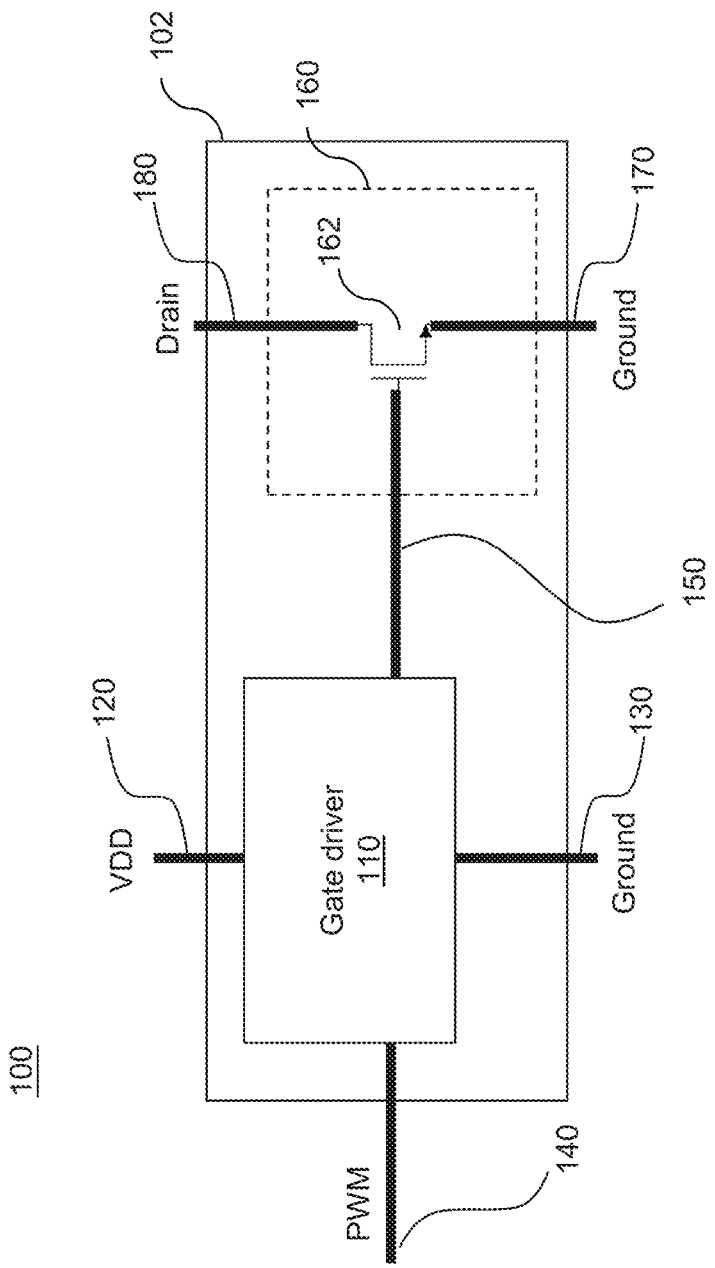
FIG. 1 is a schematic view showing a semiconductor device including a fully integrated power stage having one power transistor formed in a power transistor area, in accordance with an embodiment of the present invention.

Group III-V semiconductor materials have properties that allow them to be more suitable for use as transistor (e.g., field-effect transistor (FET)) channel material in high-power device operation. In accordance with aspects of the present invention, III-V FETs are provided in designated areas to enable high-power-density operation with low power loss and high-voltage operation. The III-V FETs provide high carrier mobility in the channel and high breakdown voltage due to large critical electric fields. Since a III-V FET is a majority carrier device, there is no reverse recovery charge. Thus, a III-V FET can save power when it is being switched on and off.

In one application, a power stage device can use one or more power transistors (e.g., FETs) as the high-power devices, and use a gate driver as the supporting circuit(s) for the power transistors in the power stages. The embodiments described herein can integrate, on a single chip, the gate driver and one or more power transistors (e.g., GaN FETs) to enable a fully integrated power stage device. For example, the one or more power transistors can be formed on a substrate in a region within one or more power transistor areas, and the gate driver can be formed on the substrate in another region of the substrate, outside of the one or more power transistor areas. By doing so, the one or more power transistors and the gate driver can be built on the same die, which reduces package size. Back-end-of-line (BEOL) processing can be performed to create interconnections among the one or more power transistors and the gate driver fabricated on the single chip.

The embodiments described herein allow for the gate driver to be spatially close to the power transistors. The short physical distance between the gate driver and the power transistors can significantly reduce the parasitic resistance and inductance introduced by the wires bonding the transistors of the gate driver and the power transistors. The small parasitic resistance and inductance between the gate driver and the power transistors can enable a faster turn-on/off speed, thereby achieving a lower switching loss. Furthermore, high speed signals are able to travel from the gate driver to the power transistors with a higher frequency and lower distortion, without creating overshoot voltage when there is large parasitic inductance. Therefore, the power stage formed in accordance with the embodiments described herein can work on a higher switching frequency. Also, the higher switching frequency of the power stage will enable a smaller form factor of any magnetic devices associated with the power stage.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, FIGS. 1-5 show various arrangements and configurations of semiconductor devices. Other arrangements and configurations are contemplated.

Each of the devices described in FIGS. 1-5 includes a main or base substrate that can include any suitable substrate structure, e.g., a bulk semiconductor, a semiconductor-on-insulator (SOI) substrate, etc. In one example, the base substrate can include a silicon-containing material. Illustrative examples of Si-containing materials suitable for the substrate can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

Each of the devices described in FIGS. 1-5 further includes a first circuit formed in a first region of the device and a second circuit formed in a second region of the device. The second circuit can include one or more transistors (e.g., FETs) connected to the first circuit. The one or more transistors can have channels formed from a different crystalline material than the material of the base substrate. For example, one or more of the transistors of the second circuit can have channels that include a semiconductor material that has properties suitable for use in high power operations, such as a III-V semiconductor material. A "III-V semiconductor material" is an alloy including elements from group III and group V of the periodic table of elements. Examples of III-V semiconductor materials include, but are not limited to, aluminum antimonide (AlSb), aluminum arsenide (AlAs), aluminum nitride (AlN), aluminum phosphide (AlP), gallium arsenide (GaAs), gallium nitride (GaN), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof.

Each of the III-V semiconductor materials may have a single crystal, multi-crystal or polycrystalline crystal structure. Each of the III-V semiconductor materials may be grown epitaxially within a trench formed in the substrate using seed and/or buffer layers.

In one embodiment, one or more of the transistors of the second circuit (e.g, FETs) have channels that include GaN and/or $Al_xGa_{1-x}N$ (referred to herein collectively as GaN transistors or GaN FETs). In the case that the substrate includes Si and the transistors of the second circuit are GaN transistors, the lattice mismatch for GaN and Si can be around 17%. This lattice mismatch can cause cracks and wafer balling during the epitaxial growth. However, as will be further described herein, such lattice mismatch issues are reduced, and the strain/stress of the lattice mismatch does not accumulate through the whole wafer.

As previously mentioned, the properties of III-V semiconductor materials (e.g., GaN/$Al_xGa_{1-x}N$) can make them suitable for use in power stages. Thus, the embodiments described herein can illustratively be used to fabricate a semiconductor device including a fully integrated power stage, with the first circuit being a gate driver circuit and the second circuit including one or more power transistors (e.g., FETs).

Although the illustrative embodiments in FIGS. 1-5 will be described with reference to a fully integrated power stage, such an application is merely exemplary, and the embodiments described herein can be applied to other types of devices and configurations that can benefit. Further details regarding the process flow for fabricating a device including a fully integrated power stage will be described below with reference to FIGS. 6-16.

Referring now to FIG. 1, a schematic view showing an exemplary semiconductor device 100 is provided. As shown, the device 100 includes a first circuit (e.g., a gate driver 110) formed on a first region of a substrate 102, and a second circuit (e.g., a transistor 162 formed in an area 160) on a second region of the substrate 102. In one embodiment, the substrate 102 includes Si, although the material of the substrate 102 is not limiting. The transistor 162 can be a FET. In one embodiment, as described above, the transistor 162 can have a channel including a semiconductor material different from a material of the substrate 102. If the device 100 includes a fully integrated power stage, the semiconductor material can include a material suitable for use as a power transistor of a power stage, such as a III-V semiconductor material (e.g., GaN/$Al_xGa_{1-x}N$).

The gate driver 110 is connected to a supply line (e.g., VDD line) 120, a ground line 130, and a pulse-width modulation (PWM) line 140. As further shown, the gate driver 110 is connected to a gate of the transistor 162 via line 150. The source/drain of transistor 162 is connected to ground line 170 and the drain/source of transistor 162 is connected to drain line 180.

Figure 2:
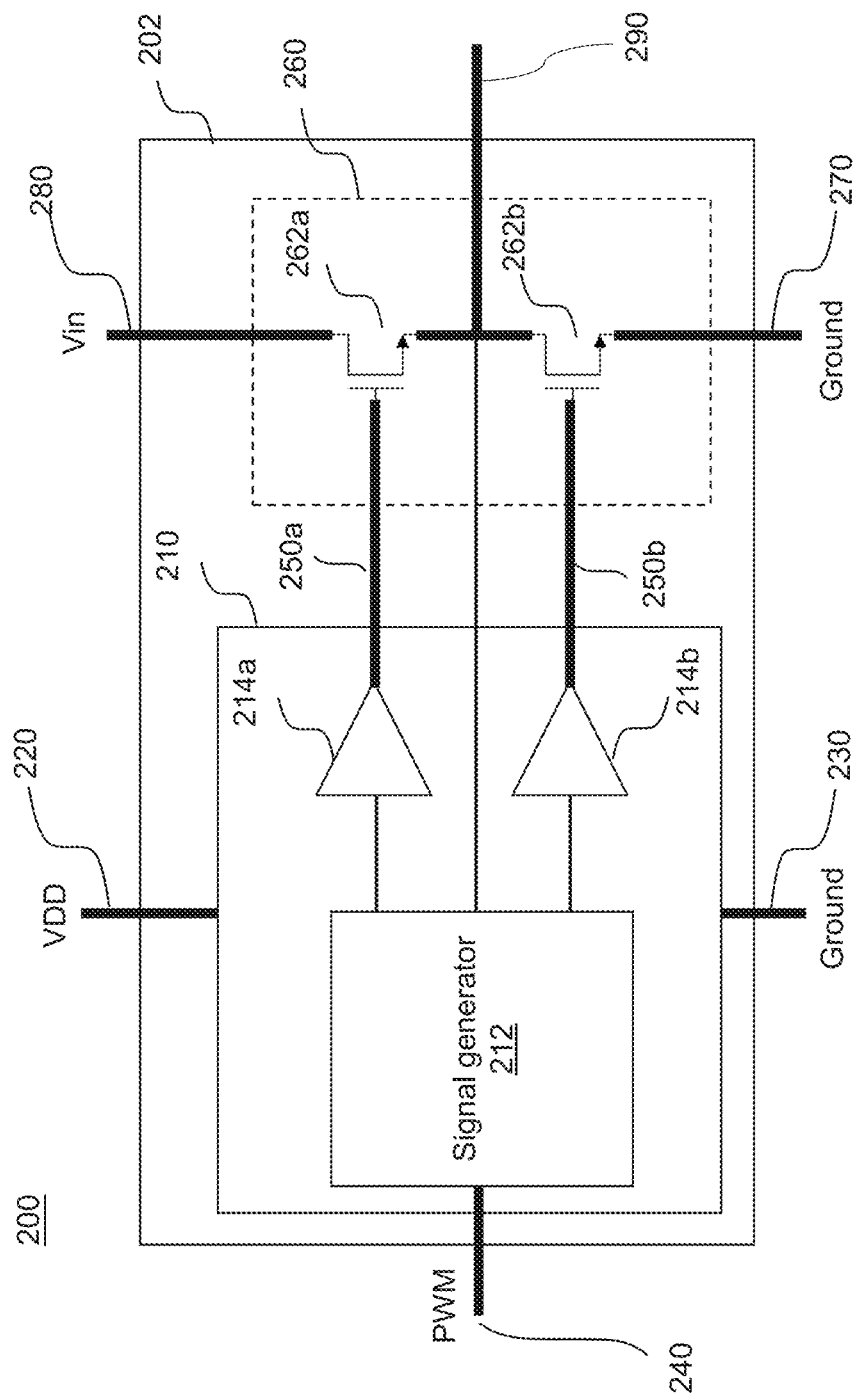
FIG. 2 is a schematic view showing a semiconductor device including a fully integrated power stage having two transistors formed in a power transistor area, in accordance with an embodiment of the present invention.

Referring to FIG. 2, a schematic view showing an exemplary semiconductor device 200 is provided. Here, in contrast to FIG. 1, more than one transistor is formed in a common area.

As shown, the device 200 includes a first circuit (e.g., a gate driver 210) formed on a first region of a substrate 202, and a second circuit (e.g., transistors 262a and 262b) formed in an area 260 on a second region of the substrate 202. In one embodiment, the substrate 202 includes Si, although the material of the substrate 202 is not limiting. One or more of the transistors 262a and 262b can be a FET. In one embodiment, as described above, one or more of the transistors 262a and 262b can have a channel including a semiconductor material different from a material of the substrate 202. If the device 200 includes a fully integrated power stage, the semiconductor material can include a material suitable for use as channel material of a power transistor of a power stage, such as a III-V semiconductor material (e.g., GaN/$Al_xGa_{1-x}N$).

The gate driver 210 is connected to a supply line (e.g., VDD line) 220, a ground line 230, and a PWM line 240. The gate driver 210 is shown including a signal generator 212 connected to buffers 214a and 214b. The buffer 214a is connected to a gate of the transistor 262a via line 250a, and the buffer 214b is connected to a gate of a transistor 262b via line 250b. In one embodiment, the buffers 214a and 214b can serve as high side and low side gate drivers, respectively, the transistor 262a serves as a high side power transistor in a regulator, and the transistor 262b serves as a low side power transistor in a regulator. The drain/source of transistor 262a is shown connected to $V_{in}$ line 280 and the source/drain transistor 262b is shown connected to ground line 270. The source/drain of the transistor 262a is connected to the drain/source of the transistor 262b via line 290.

Figure 3:
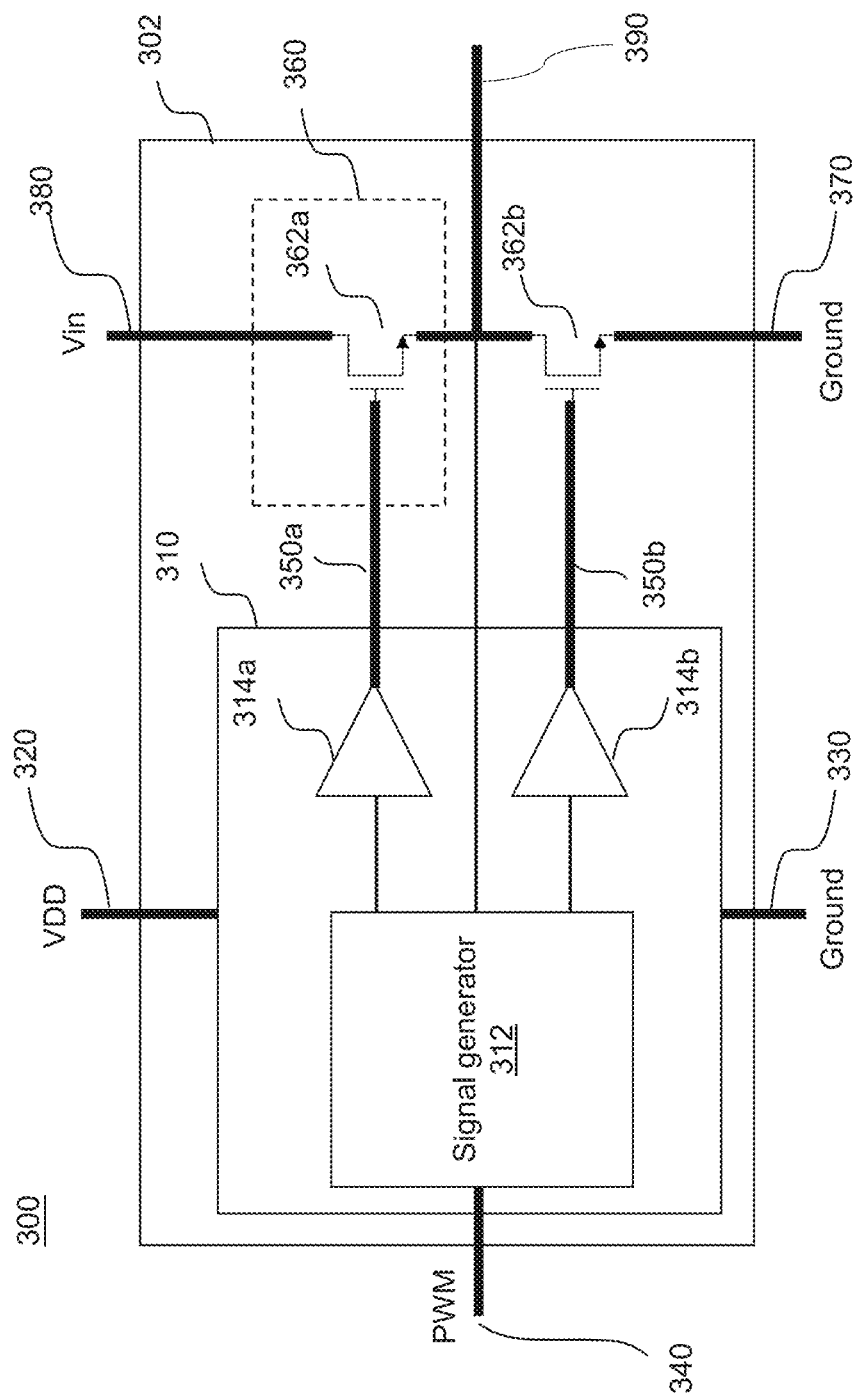
FIG. 3 is a schematic view showing a semiconductor device including a fully integrated power stage having one transistor formed in a power transistor area and another transistor formed outside of the power transistor area, in accordance with an embodiment of the present invention.

Referring to FIG. 3, a schematic view showing an exemplary semiconductor device 300 is provided. Here, in contrast to FIG. 2, transistors are formed in separate areas.

As shown, device 300 includes a first circuit (e.g., gate driver 310) formed on a first region of a substrate 302, and a second circuit (e.g., transistors 362a and 362b) formed on a second region of the substrate 302. In one embodiment, the substrate 302 includes Si, although the material of the substrate 202 is not limiting. The transistor 362a is formed in the second region of the substrate 302 in an area 360a, while the transistor 362b is formed in the second region of the substrate 302 outside of the area 360a. One or more of the transistors 362a and 362b can be a FET. In one embodiment, as described above, transistor 362a can have a channel including a semiconductor material different from a material of the substrate 302. If the device 300 includes a fully integrated power stage, the semiconductor material can include a material suitable for use as channel material of a power transistor of a power stage, such as a III-V semiconductor material (e.g., GaN/$Al_xGa_{1-x}N$). The transistor 362b can have a channel including Si.

The gate driver 310 is connected to a supply line (e.g., VDD line) 320, a ground line 330, and a PWM line 340. The gate driver 310 is shown including a signal generator 312 connected to buffers 314a and 314b. The buffer 314a is connected to a gate of the transistor 362a via line 350a, and the buffer 314b is connected to a gate of the transistor 362b via line 350b. In one embodiment, the buffers 314a and 314b can serve as high side and low side gate drivers, respectively, the transistor 362a serves as a high side power transistor in a regulator, and the transistor 362b serves as a low side power transistor in a regulator. The drain/source of transistor 362a is shown connected to $V_{in}$ line 380 and the source/drain of transistor 362b is shown connected to ground line 370. The source/drain of the transistor 362a is connected to the drain/source of the transistor 362b via line 390.

Figure 4:
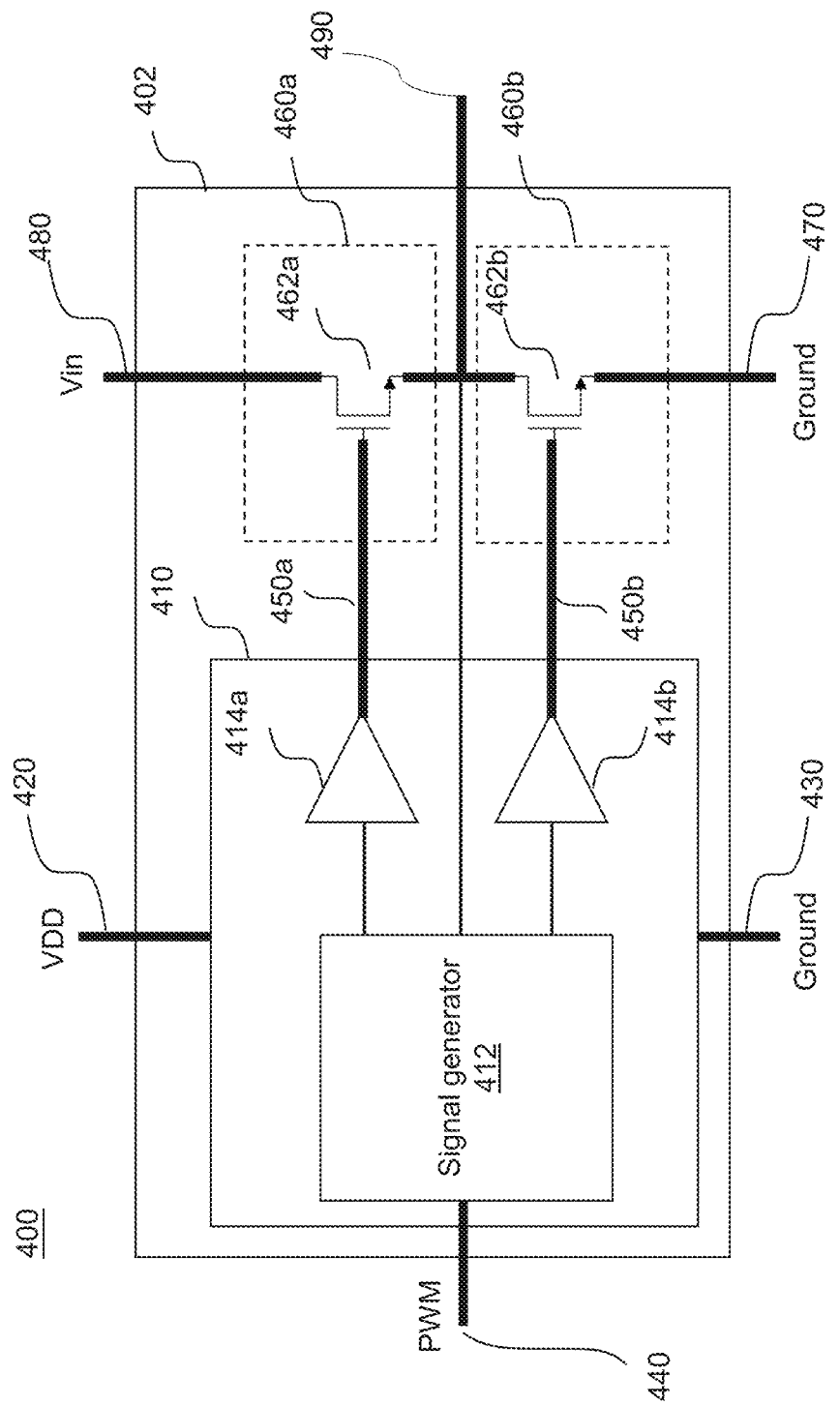
FIG. 4 is a schematic view showing a semiconductor device including a fully integrated power stage having two transistors each formed in a separate power transistor area and connected to each other, in accordance with an embodiment of the present invention.

Referring to FIG. 4, a schematic view showing an exemplary semiconductor device 400 is provided. Here, similar to FIG. 3, transistors are formed in separate areas. However, both transistors are formed in designated areas (e.g., power transistor areas of a power stage device).

As shown, the device 400 includes a first circuit (e.g., a gate driver 410) formed on a first region of a substrate 402, and a second circuit (e.g., transistors 462a and 462b) formed on a second region of the substrate 402. In one embodiment, the substrate 402 includes Si, although the material of the substrate 402 is not limiting. The transistor 462a is formed on the second region of the substrate 402 in an area 460a, while the transistor 462b is formed on the second region of the substrate 402 in an area 460b. One or more of the transistors 462a and 462b can be a FET. In one embodiment, as described above, one or more of transistors 462a and 462b can have a channel including a semiconductor material different from a material of the substrate 402. If the device 400 includes a fully integrated power stage, the semiconductor material can include a material suitable for use as channel material of a power transistor of a power stage, such as a III-V semiconductor material (e.g., GaN/Al$_x$Ga$_{1-x}$N).

The gate driver 410 is shown including a signal generator 412 connected to buffers 414a and 414b. The gate driver 410 is connected to a supply line (e.g., VDD line) 420, ground line 430, and PWM line 440. The buffer 414a is connected to a gate of the transistor 462a via line 450a, and the buffer 414b is connected to a gate of the transistor 462b via line 450b. In one embodiment, the buffers 414a and 414b can serve as high side and low side gate drivers, respectively, the transistor 462a serves as a high side power transistor in a regulator, and the transistor 462b serves as a low side power transistor in a regulator. The drain/source of transistor 462a is shown connected to $V_{in}$ line 480 and the source/drain of transistor 462b is shown connected to ground line 470. The source/drain of the transistor 462a is connected to the drain/source of the transistor 462b via line 490.

Figure 5:
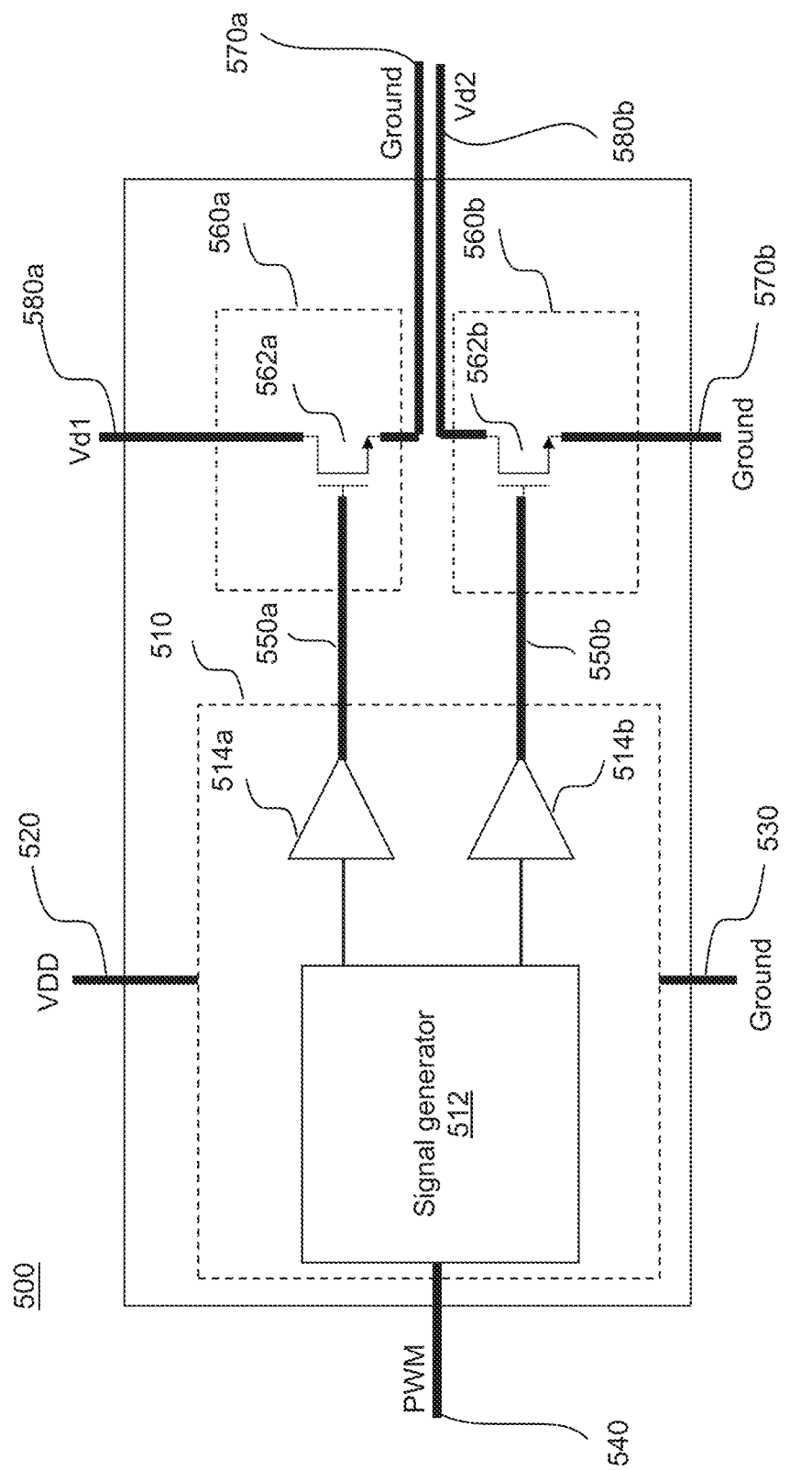
FIG. 5 is a schematic view showing a semiconductor device including a fully integrated power stage having two transistors each formed in a separate power transistor area and are separated from each other, in accordance with an embodiment of the present invention.

Referring to FIG. 5, a schematic view showing an exemplary semiconductor device 500 is provided. Here, similar to FIG. 4, transistors are formed in separate designated areas (e.g., power transistor areas of a power stage device). However, the transistors are separate from each other (e.g., not connected to each other).

As shown, the device 500 includes a first circuit (e.g., a gate driver 510) formed on a first region of a substrate 502, and a second circuit (e.g., transistors 562a and 562b) formed on a second region of the substrate 502. In one embodiment, the substrate 502 includes Si, although the material of the substrate 502 is not limiting. Transistor 562a is formed on the second region of the substrate 502 in an area 560a, while transistor 562b is formed on the second region of the substrate 502 in an area 560b. One or more of the transistors 562a and 562b can be a FET. In one embodiment, as described above, one or more of transistors 562a and 562b can have a channel including a semiconductor material different from a material of the substrate 502. If the device 500 includes a fully integrated power stage, the semiconductor material can include a material suitable for use as channel material of a power transistor of a power stage, such as a III-V semiconductor material (e.g., GaN/Al$_x$Ga$_{1-x}$N).

The gate driver 510 is shown including a signal generator 512 connected to buffers 514a and 514b. The gate driver 510 is connected to a supply line (e.g., VDD line) 520, a ground line 530, and a PWM line 540. The buffer 514a is connected to a gate of the transistor 562a via line 550a, and the buffer 514b is connected to a gate of the transistor 562b via line 550b. In one embodiment, the buffers 514a and 514b can serve as high side and low side gate drivers, respectively, the transistor 562a serves as a high side power transistor in a regulator, and the transistor 562b serves as a low side power transistor in a regulator. The source/drain of transistor 562a is shown connected to ground line 570a and drain/source of transistor 562a is shown connected to $V_{d1}$ line 580a, and the source/drain of transistor 562b is shown connected to ground line 570b and the drain/source of transistor 562b is connected to $V_{d2}$ line 580b.

Accordingly, FIGS. 1-5 illustrate various configurations of devices, such as devices including fully integrated power stages, that can be realized in accordance with the embodiments described herein.

FIGS. 6-16 depicts respective steps of a process flow for fabricating a semiconductor device, such as a fully integrated power stage device.

Figure 6:
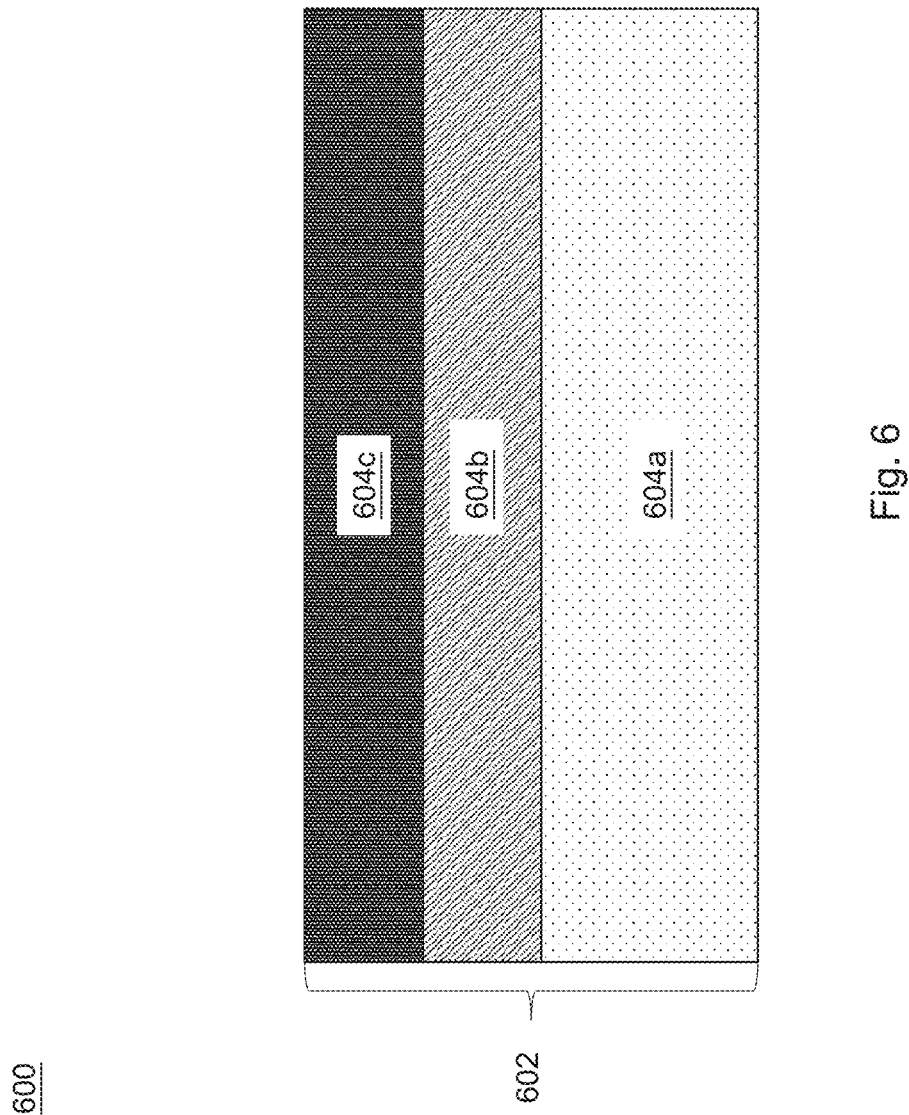
FIG. 6 is cross-sectional view of a substrate provided during the fabrication of the semiconductor device including a fully integrated power stage, in accordance with an embodiment of the present invention.

Referring to FIG. 6, a substrate 602 is provided. In one embodiment, and as shown, the substrate 602 can include layers 604a, 604b and 604c. For example, the substrate 602 can be a semiconductor-on-insulator (SOI) substrate, with the layer 604a including Si (e.g., Si (111)), the layer 604b including an oxide, and the layer 604c including Si (e.g., Si (100)).

Figure 7:
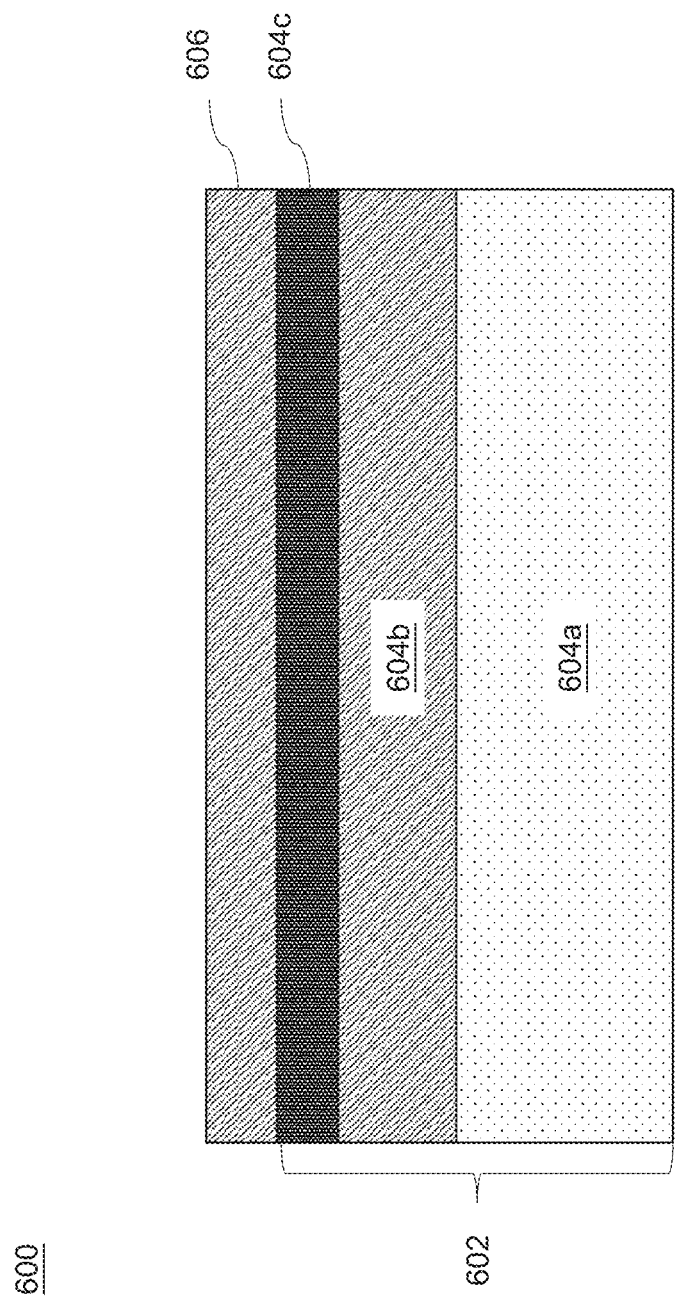
FIG. 7 is cross-sectional view of a dielectric formed on a substrate during the fabrication of a semiconductor device including a fully integrated power stage, in accordance with an embodiment of the present invention.

Referring to FIG. 7, a dielectric layer 606 is formed on the layer 604c. In one embodiment, the dielectric layer 606 includes an oxide. For example, the dielectric layer can be formed by thermally oxidizing the layer 604c. However, any process suitable for forming the dielectric layer 606 can be used in accordance with the embodiments described herein.

Figure 8:
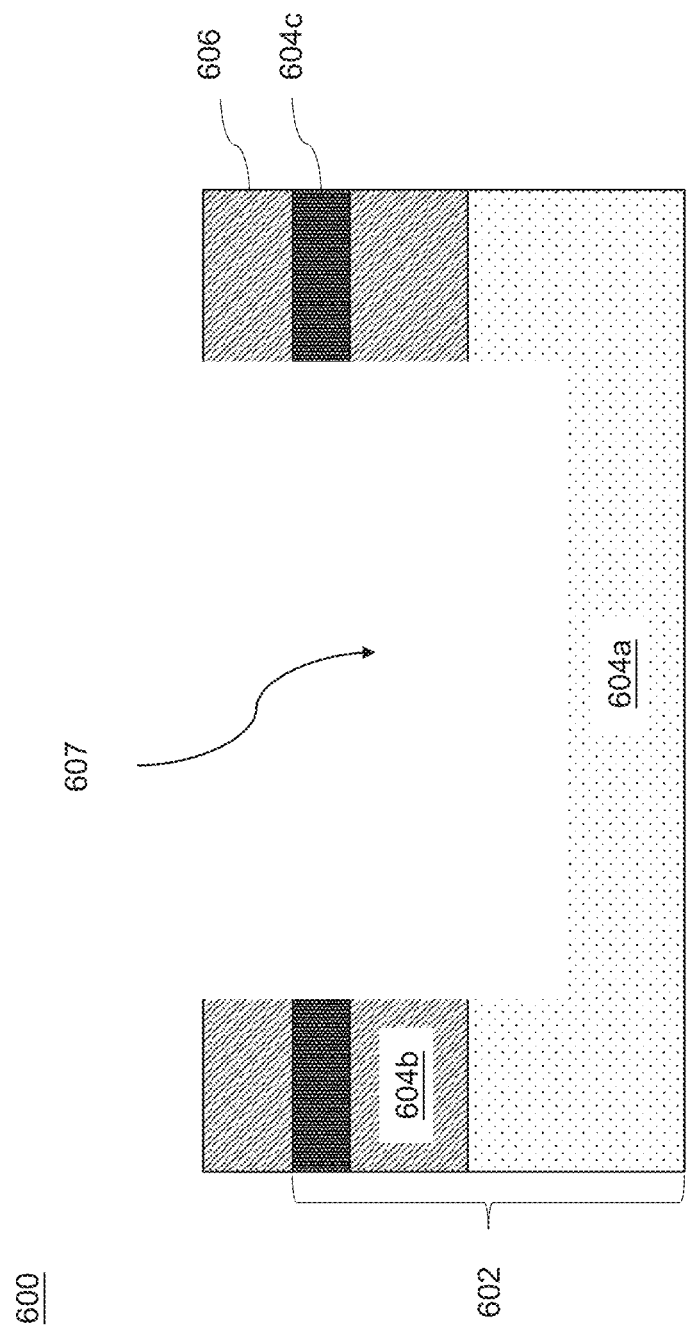
FIG. 8 is cross-sectional view of a trench region formed during the fabrication of a semiconductor device including a fully integrated power stage, in accordance with an embodiment of the present invention.

Referring to FIG. 8, a trench region 607 is formed by removing a portion of the device 600. In one embodiment, an etch process can be employed form the region 607. Any etch process can be used to form the trench region 607 in accordance with the embodiments described herein.

Figure 9:
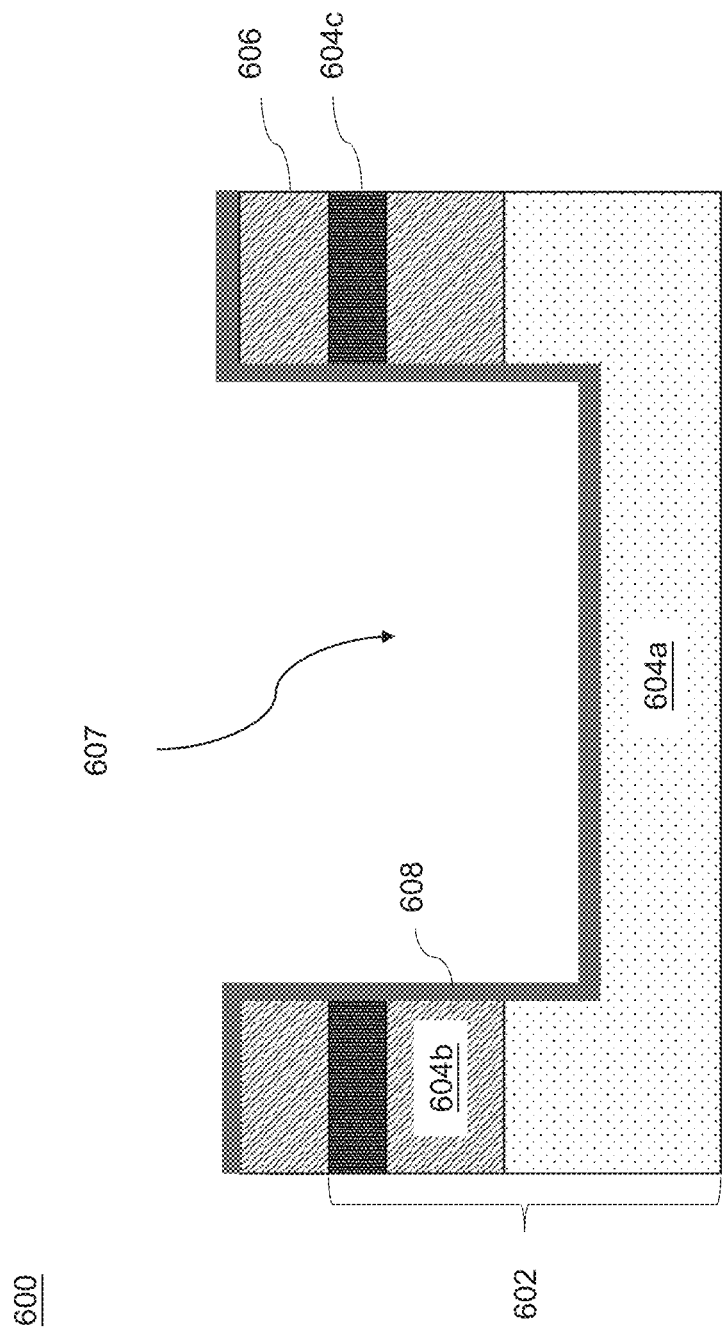
FIG. 9 is cross-sectional view of a spacer layer formed during the fabrication of a semiconductor device including a fully integrated power stage, in accordance with an embodiment of the present invention.

Referring to FIG. 9, a spacer layer 608 is conformally deposited on the substrate 602. In one embodiment, the spacer layer 608 can include a silicon nitride material (e.g., SiN).

Figure 10:
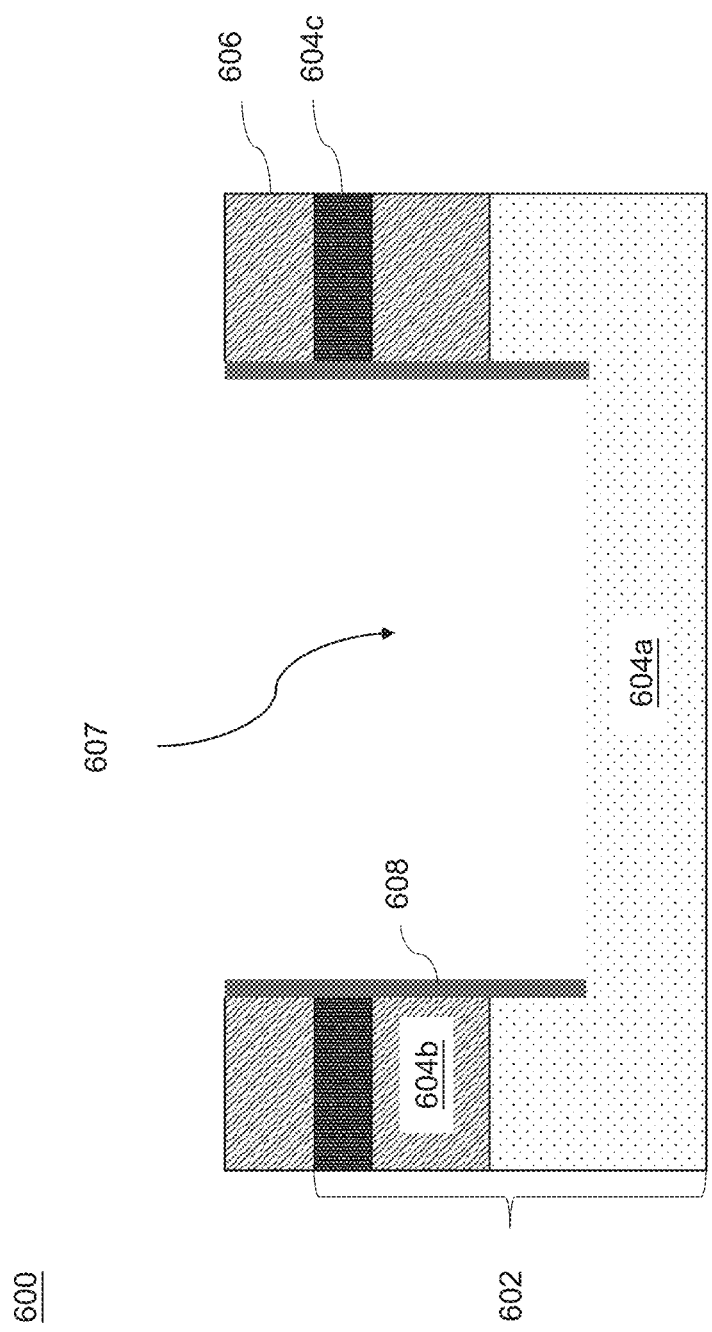
FIG. 10 is cross-sectional view of sidewalls formed from a spacer layer during the fabrication of a semiconductor device including a fully integrated power stage, in accordance with an embodiment of the present invention.

Referring to FIG. 10, portions of the spacer layer 608 are removed to form sidewalls on the substrate 602 and the dielectric layer 606. In one embodiment, an etch process, such as reactive-ion etching (RIE), is used to remove the portions of the spacer layer 608. However, any process can be used to remove the portions of the spacer layer 608 in accordance with the embodiments described herein.

Figure 11:
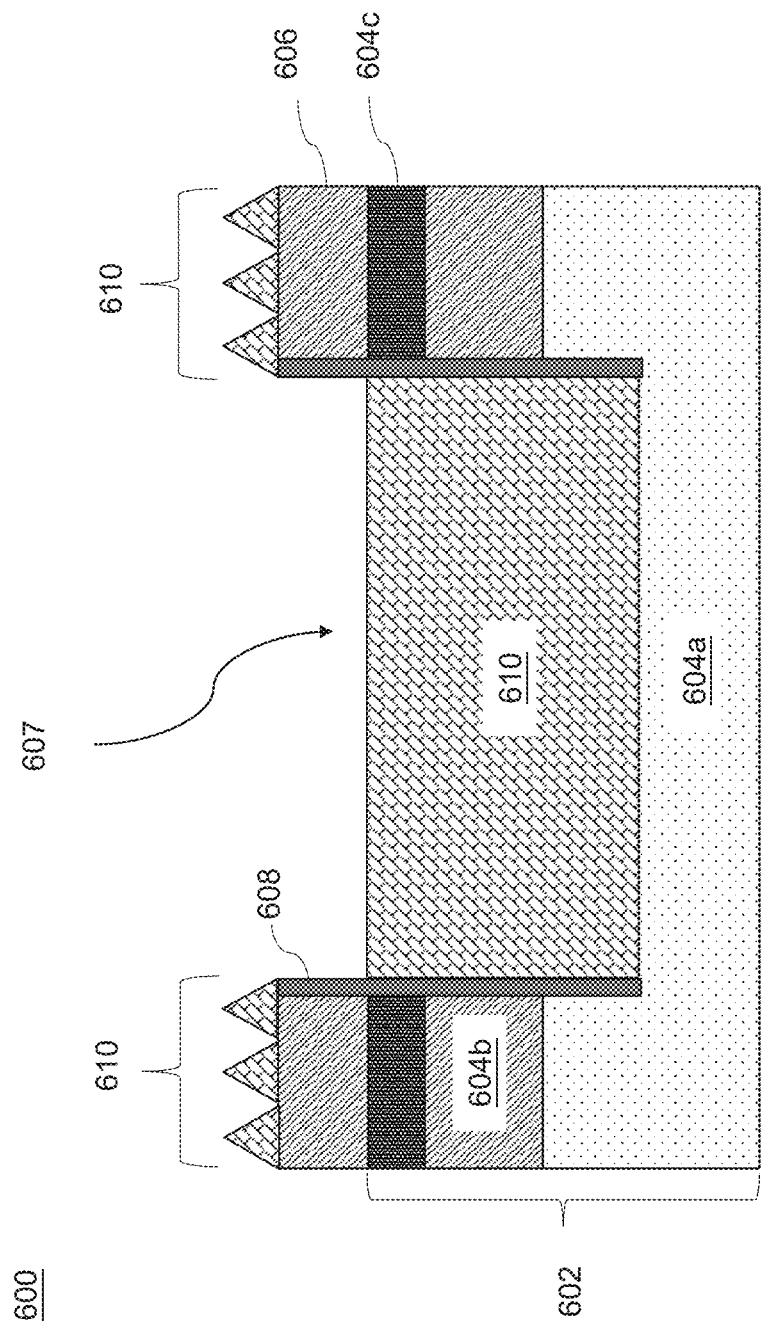
FIG. 11 is cross-sectional view of a semiconductor material formed in a trench during the fabrication of a semiconductor device including a fully integrated power stage, in accordance with an embodiment of the present invention.

Referring to FIG. 11, semiconductor material 610 is formed in the trench region 607. In one embodiment, the semiconductor material 610 includes one or more layers. The semiconductor material can include a semiconductor material different from a material of the substrate 602, such as a III-V semiconductor material. For example, in an illustrative embodiment, the semiconductor material 610 can include GaN and/or Al$_x$Ga$_{1-x}$N, where x=0~1. However, such materials are not considered limiting.

The semiconductor material 610 can be formed via epitaxial growth or deposition. The terms "epitaxial growth and/or deposition" and "epitaxially formed and/or grown,"

mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

Any suitable technique for forming or growing the semiconductor material 610 can be utilized in accordance with the embodiments described herein. For example, if semiconductor material is of a different material than the layer 604a (e.g., III-V semiconductor material), the semiconductor material 610 can be grown by implementing a seed and/or buffer layers. For example, an aluminum nitride (AlN) seed layer and a buffer layer (e.g., $Al_xGa_{1-x}N$ buffer layer) can be formed before the main GaN/$Al_xGa_{1-x}N$ layer. The AlN seed layer can be around 120 nm, and the AlGaN buffer layer can be around 450 nm. However, such dimensions for the seed and buffer layers are not limiting.

The trench region 607 is maintained with sufficiently small dimensions to confine and/or reduce defects and reduce lattice mismatch concerns. This enables the use of crystalline semiconductor materials (e.g., GaN) formed on a different crystalline material (e.g., Si). The dimensions of the trench region 607 will depend on the materials and defect tolerances of the FETs formed from the semiconductor material formed in the trench region 607.

Regarding the GaN transistor embodiment, the lattice mismatch for GaN and Si is around 17%. This lattice mismatch can cause cracks and wafer balling during the epitaxial growth. However, since the GaN/AlGaN is only grown in the trench region 607, such lattice mismatch issues are reduced in accordance with the embodiments described herein. Accordingly, the strain/stress of the lattice mismatch does not accumulate through the whole wafer.

Figure 12:
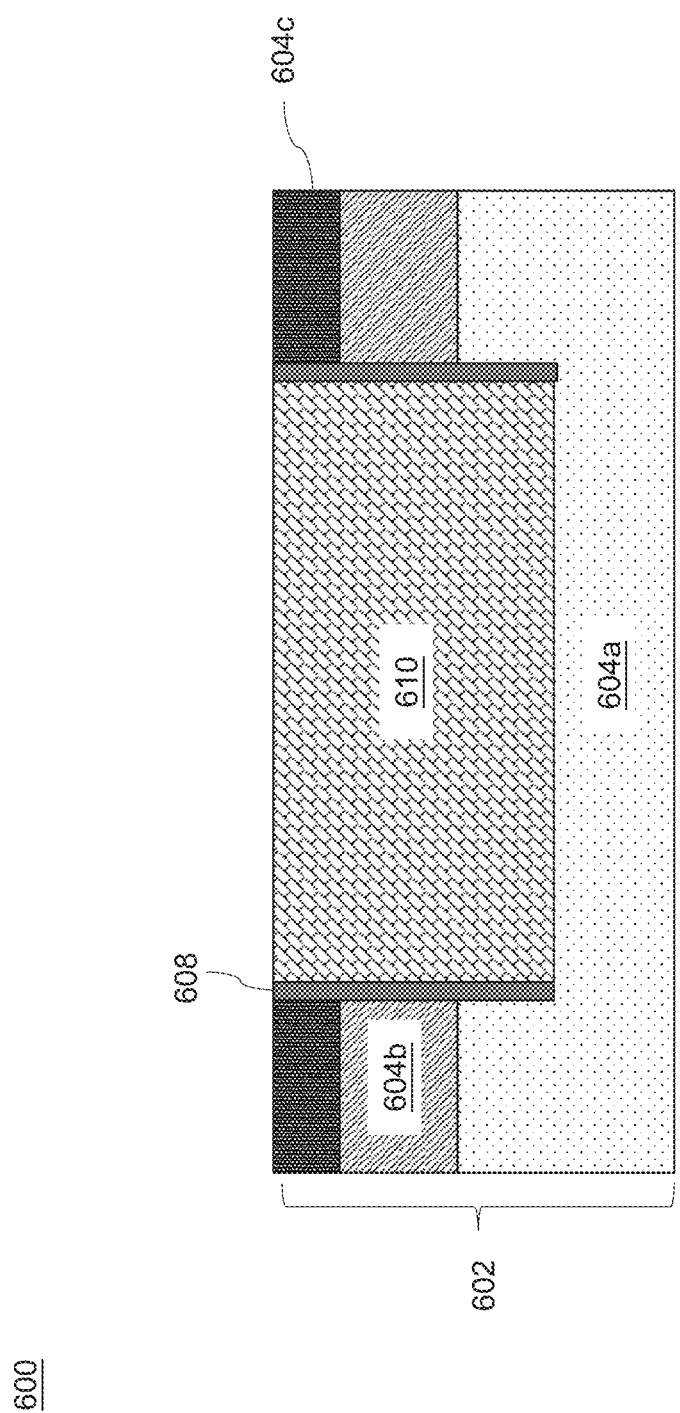
FIG. 12 is cross-sectional view of planarization performed during the fabrication of a semiconductor device including a fully integrated power stage, in accordance with an embodiment of the present invention.

Referring to FIG. 12, the device 600 is planarized down to the substrate 602. In one embodiment, chemical-mechanical planarization (CMP) is used to planarize the device 600. However, any planarization process suitable planarizing the device 600 can be used in accordance with the embodiments described herein.

Figure 13:
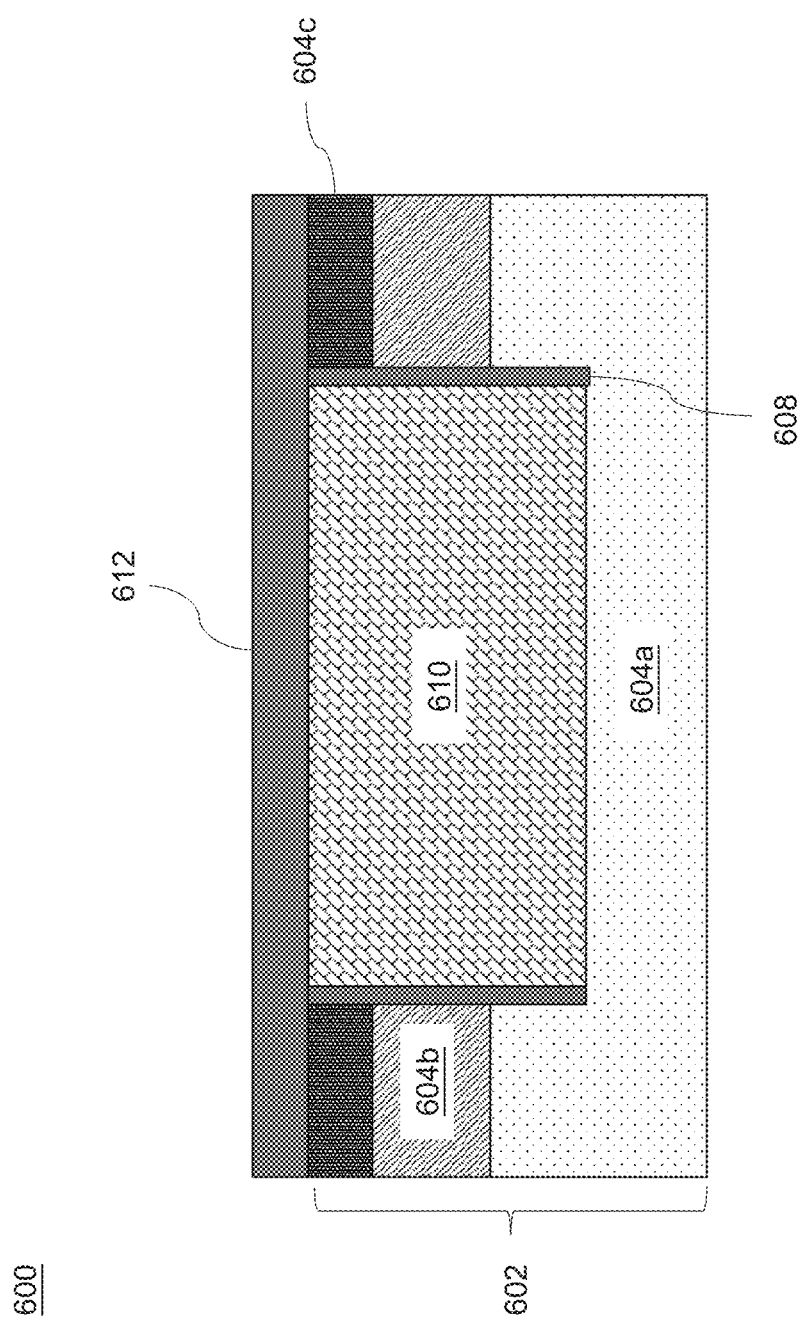
FIG. 13 is cross-sectional view of a cap layer formed during the fabrication of a semiconductor device including a fully integrated power stage, in accordance with an embodiment of the present invention.

Referring to FIG. 13, a cap layer 612 is formed on the substrate 602 and the semiconductor material 610. In one embodiment, the cap layer 612 includes SiN. However, any material suitable for use as a cap layer can be used in accordance with the embodiments described herein.

Figure 14:
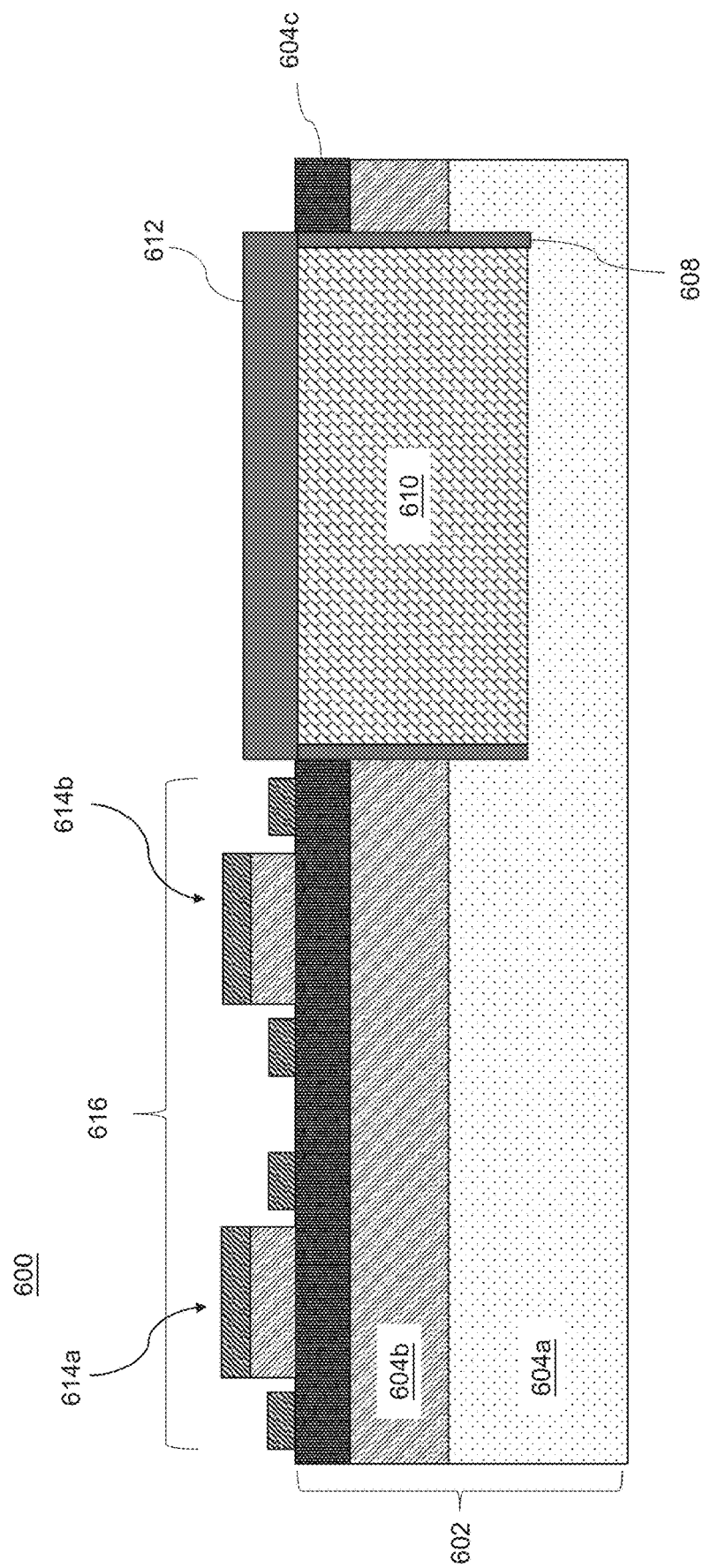
FIG. 14 is cross-sectional view of devices formed on a substrate in a first region during the fabrication of a semiconductor device including a fully integrated power stage, in accordance with an embodiment of the present invention.

Referring to FIG. 14, devices 614a and 614b are formed on layer 604c in region 616 while the semiconductor material 610 is capped by the cap layer 612. In one embodiment, devices 614a and 614b are formed via Si CMOS fabrication. The devices 614a and 614b can form a gate driver device of a power stage.

Figure 15:
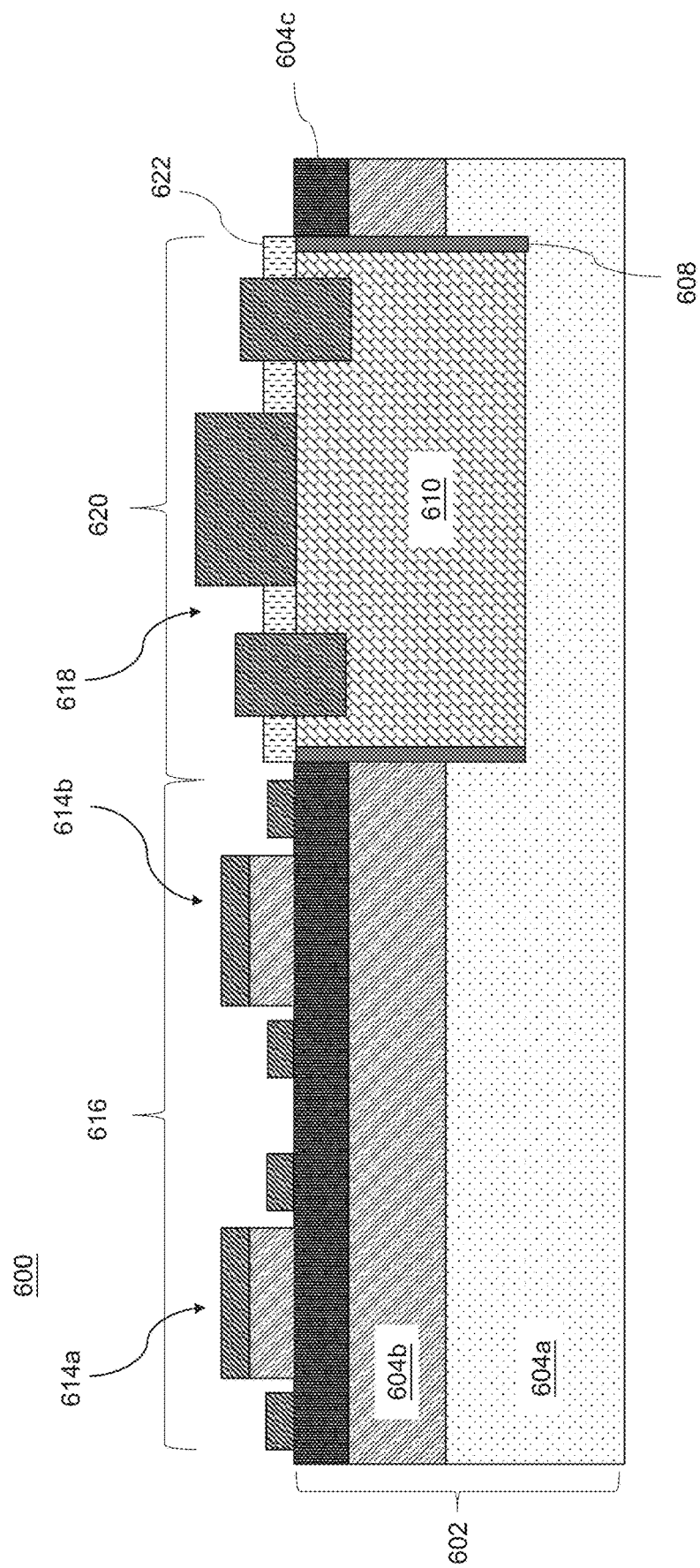
FIG. 15 is cross-sectional view of a device formed on a substrate in a second region during the fabrication of a semiconductor device including a fully integrated power stage, in accordance with an embodiment of the present invention.

Referring to FIG. 15, the cap layer 612 is removed, a power transistor (e.g., power FET) device 618 including a transistor is formed in region 620, and a passivation layer 622 is deposited. In one embodiment, the device 618 includes a FET. The transistor can be a power transistor of a power stage. Although not shown, the devices in region 616 can be protected during the formation of the device 618 and the passivation layer 622. In the embodiment in which semiconductor material 610 includes GaN and/or $Al_xGa_{1-x}N$, the device 618 includes a GaN and/or $Al_xGa_{1-x}N$ transistor. In one embodiment, the passivation layer 622 includes SiN. However, any material suitable for use as a passivation layer can be utilized to form the passivation layer 622.

Figure 16:
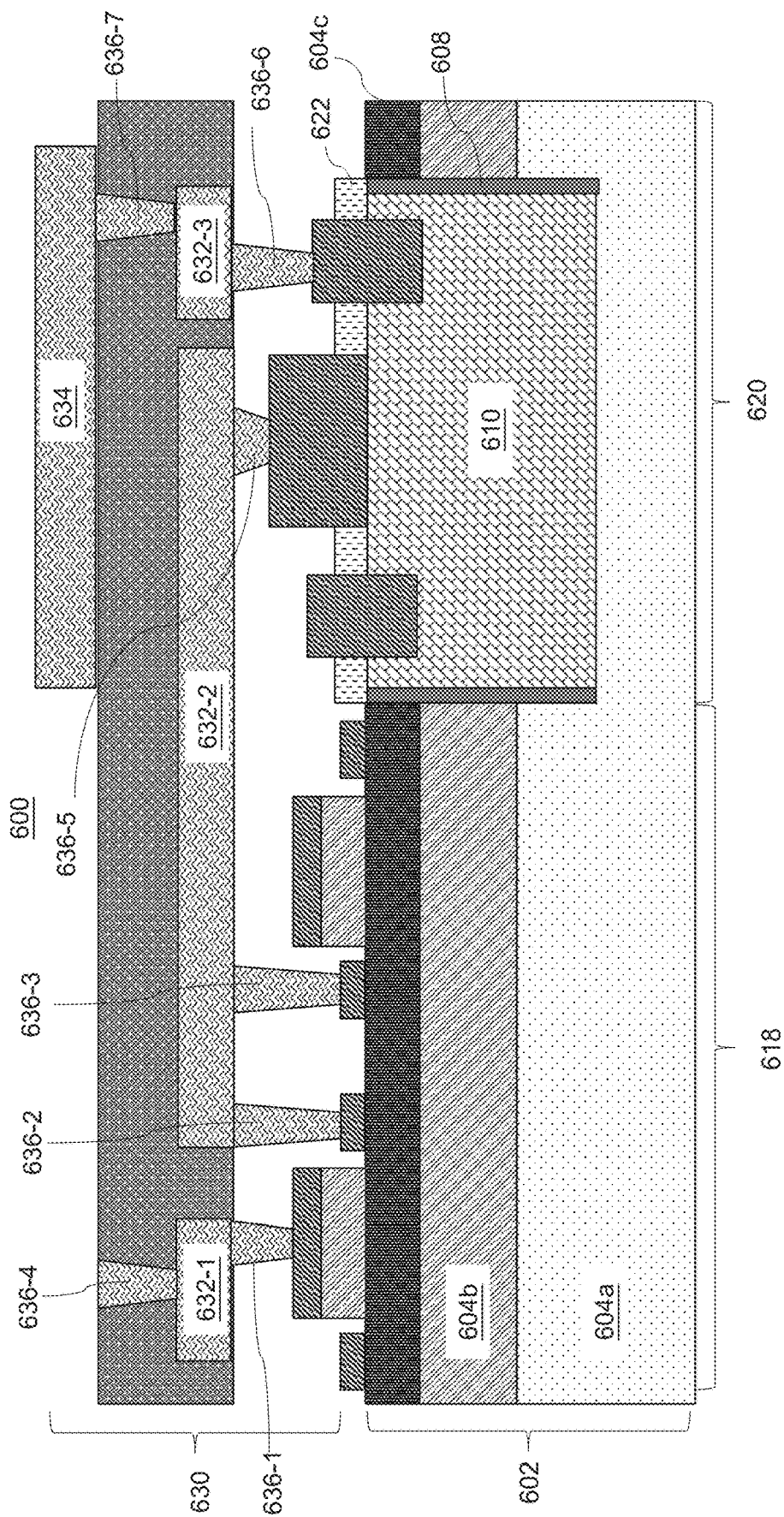
FIG. 16 is cross-sectional view of back-end-of-line (BEOL) connections formed during the fabrication of a semiconductor device including a fully integrated power stage, in accordance with an embodiment of the present invention.

Referring to FIG. 16, back-end-of-line (BEOL) processing is performed to create a BEOL connection 630 that connects the devices 614a and 614b in with the device 618. For example, as shown, the BEOL connection 630 includes a first metallization layer having metal layers, including metal layers 632-1, 632-2 and 632-3, and a second metallization layer including a metal layer 634. The devices 614a and 614b and the device 618 are connected to the first metallization layer, and the first metallization layer is connected to the second metallization layer, with interconnects (e.g., vias filled with interconnect material). Within the region 616, the interconnects include an interconnect 636-1 connecting to the metal layer 632-1, interconnects 636-2 and 636-3 connecting to the metal layer 632-2, and an interconnect 632-4 formed from the metal layer 632-1. Within the region 620, the interconnects include an interconnect 636-5 connecting to the metal layer 632-2, an interconnect 636-6 connecting to the metal layer 632-3, and an interconnect 636-7 formed from the metal layer 632-1 and connecting to the metal layer 634.

Having described preferred embodiments of a system and method of fabricating a semiconductor device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device, comprising:
  for a substrate having a first region protected by a cap layer, forming a first device on a second region of the substrate entirely lacking the cap layer, the substrate including an insulator layer disposed between a first semiconductor layer and a second semiconductor layer each including a first semiconductor material; and
  forming a second device on the first region, including removing the cap layer, and forming one or more transistors each having a channel formed from a second semiconductor material different from the first semiconductor material.

2. The method of claim 1, wherein the second semiconductor material is formed on the first semiconductor layer in a trench within the substrate.

3. The method of claim 1, wherein the second semiconductor material includes III-V semiconductor material.

4. The method of claim 3, wherein the III-V semiconductor material includes at least one of gallium nitride (GaN) and aluminum gallium nitride (AlGaN).

5. The method of claim 1, wherein the first device includes a gate driver circuit of a power stage, and wherein the one or more transistors serve as one or more power transistors of the power stage.

6. The method of claim 5, wherein the one or more transistors include a first transistor serving as a high side power transistor and a second transistor serving as a low side power transistor of a power stage, and wherein the gate driver circuit includes a high side gate driver and a low side gate driver.

7. The method of claim 6, wherein a source/drain of the first transistor is connected to a drain/source of the second transistor.

8. The method of claim 7, wherein the first and second transistors are formed in separate areas or in a same area.

9. The method of claim 6, wherein the first and second transistors are formed in separate areas, and wherein sources of the first and second transistors are connected to ground and drains of the first and second transistors are separate.

10. The method of claim 1, further comprising connecting the first device with respective gates of the one or more transistors of the second device.

11. A method for fabricating a semiconductor device, comprising:
   for a substrate including an insulator layer disposed between a first semiconductor layer and a second semiconductor layer each including a first semiconductor material, forming a trench within a first region of the substrate to the first semiconductor layer;
   forming a second semiconductor material different from the first semiconductor material within the trench;
   forming a cap layer on the first region of the substrate, wherein a second region of the substrate entirely lacks the cap layer;
   forming a first device on the second region of the substrate, the cap layer protecting the first region during the formation of the first device; and
   forming a second device on the first region, including removing the cap layer, and forming one or more transistors each having a channel formed from the second semiconductor material.

12. The method of claim 11, wherein the second semiconductor material includes III-V semiconductor material.

13. The method of claim 12, wherein the III-V semiconductor material includes at least one of gallium nitride (GaN) and aluminum gallium nitride (AlGaN).

14. The method of claim 11, wherein the first device includes a gate driver circuit of a power stage, and wherein the one or more transistors serve as one or more power transistors of the power stage.

15. The method of claim 14, wherein the one or more transistors include a first transistor serving as a high side power transistor and a second transistor serving as a low side power transistor of a power stage, and wherein the gate driver circuit includes a high side gate driver and a low side gate driver.

16. The method of claim 15, wherein a source/drain of the first transistor is connected to a drain/source of the second transistor.

17. The method of claim 16, wherein the first and second transistors are formed in separate areas or in a same area.

18. The method of claim 15, wherein the first and second transistors are formed in separate areas, and wherein sources of the first and second transistors are connected to ground and drains of the first and second transistors are separate.

19. The method of claim 11, further comprising connecting the first device with respective gates of the one or more transistors of the second device.

20. A method for fabricating a semiconductor device, comprising:
   forming a dielectric layer on a substrate including an insulator layer disposed between a first semiconductor layer and a second semiconductor layer each including a first semiconductor material;
   forming a trench region within a first region of the substrate to the first semiconductor layer by removing a portion of the substrate and the dielectric layer;
   conformally depositing a spacer layer along the substrate and the dielectric layer;
   forming sidewalls within the trench by removing portions of the spacer layer;
   epitaxially growing a second semiconductor material within the trench region, the second semiconductor material being different from the first semiconductor material;
   planarizing down to the substrate after epitaxially growing the second semiconductor material;
   forming a cap layer on the first region, wherein a second region of the substrate entirely lacks the cap layer;
   forming a first device including a gate driver circuit of a power stage on a substrate in the second region, the cap layer protecting the first region during the formation of the first device;
   forming a second device on the substrate in the first region, including removing the cap layer, and forming one or more power transistors of the power stage having channels including the second semiconductor material; and
   connecting the first device with respective gates of the one or more transistors of the second device.

* * * * *